United States Patent [19]

Komoda et al.

[11] Patent Number: 5,541,861
[45] Date of Patent: Jul. 30, 1996

[54] LOGIC SIMULATOR

[75] Inventors: Michio Komoda; Naoko Omori, both of Itami, Japan

[73] Assignee: Mitsubishi Denki Kabushiki Kaisha, Tokyo, Japan

[21] Appl. No.: 212,788

[22] Filed: Mar. 15, 1994

[30]     Foreign Application Priority Data

Mar. 29, 1993 [JP] Japan ................................. 5-069557

[51] Int. Cl.⁶ .............................. G06G 7/48; G06F 19/00
[52] U.S. Cl. ............................................ 364/578; 364/488
[58] Field of Search .................................. 364/488, 489, 364/490, 491, 578; 371/22.3, 26

[56]                References Cited

U.S. PATENT DOCUMENTS

| | | | |
|---|---|---|---|
| 4,922,445 | 5/1990 | Mizoue et al. | 364/578 |
| 4,961,156 | 10/1990 | Takasaki | 364/578 |
| 5,051,938 | 9/1991 | Hyduke | 364/578 |
| 5,164,911 | 11/1992 | Juran et al. | 364/578 |
| 5,177,440 | 1/1993 | Walker, III et al. | 364/578 |
| 5,220,512 | 6/1993 | Watkins et al. | 364/489 |
| 5,278,769 | 1/1994 | Bair et al. | 364/490 |
| 5,325,309 | 6/1994 | Halaviati et al. | 364/488 |
| 5,363,319 | 11/1994 | Okuda | 364/578 |

FOREIGN PATENT DOCUMENTS

0404482  12/1990  European Pat. Off. .

*Primary Examiner*—Vincent N. Trans
*Attorney, Agent, or Firm*—Oblon, Spivak, McClelland, Maier & Neustadt, P.C.

[57]                  ABSTRACT

There is disclosed a logic simulator wherein a logical action analyzer (2) receives a net list (4) and macro cell data (5) and performs logical action analysis on a circuit to be simulated for each macro cell on the basis of signal changes given from signal detection information of a signal change detector (1) such that, if a macro cell accepts an input signal of an indefinite value (X), the indefinite value (X) is replaced with a propagation logical expression based on the input signal of its immediately preceding macro cell for logical operation, whereby the logic simulator is enabled to perform logic simulation without reduction in degree of integration and efficiency of the logic circuit to be practically fabricated after logic simulation.

12 Claims, 8 Drawing Sheets

LOGIC SIMULATOR

BACKGROUND OF THE INVENTION

1. Field of the Invention

The present invention relates to a logic simulator for semiconductor integrated circuit devices.

2. Description of the Background Art

Figure 14:
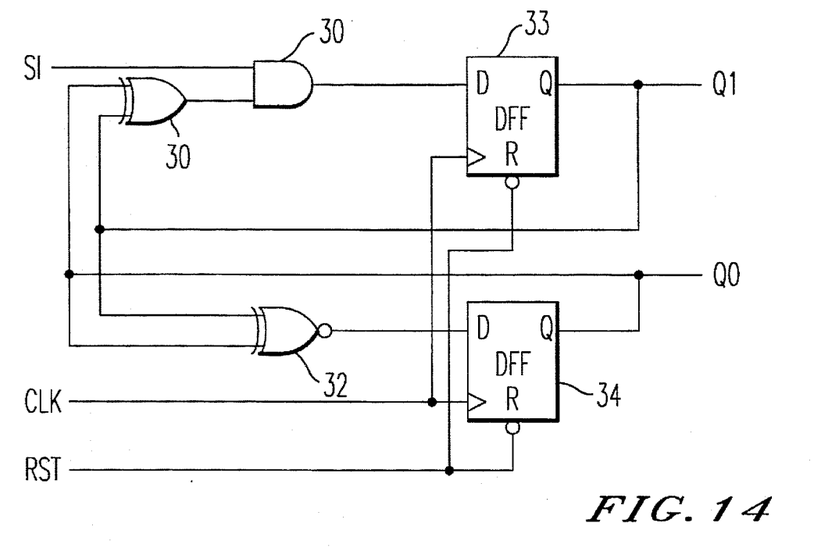
FIG. 14 is a circuit diagram of an exemplary circuit to be simulated.

FIG. 14 is a circuit diagram of an exemplary logic circuit to be logic-simulated by a logic simulator.

Referring to FIG. 14, an input signal SI is applied to a first input of an AND gate 31. A second input of the AND gate 31 receives the output of an exclusive-OR gate 30, and the output of the AND gate 31 is applied to a D-input of a DFF (D flip-flop) 33.

The DFF 33 has a clock input receiving a clock signal CLK and outputs a Q-output Q1 to the outside. The Q-output Q1 is also applied to first inputs of the exclusive OR gate 30 and an exclusive-NOR gate 32. A DFF 34 has a clock input receiving the clock signal CLK and a D-input receiving the output of the exclusive-NOR gate 32 and outputs a Q-output Q0 to the outside. The Q-output Q0 is also applied to second inputs of the exclusive-OR gate 30 and exclusive-NOR gate 32 in common. A reset signal RST is applied to reset inputs R of the DFFs 33 and 34.

The circuit to be simulated constructed as described above has the property of providing, when the input signal SI is set to "H", the Q-output Q1 of "H" and the Q-output Q0 of "L" after input of two pulses of the clock signal CLK independently of the initial value of the Q-outputs Q1 and Q10 of the DFFs 33 and 34.

In logic simulation by the conventional logic simulator, the output constantly has an indefinite value X where the input signal has the indefinite value X. Thus, when the logic circuit as above constructed is to be simulated wherein the D-input of the DFF 33 or the DFF 34 is indefinite X, the Q-output Q1 or the Q-output Q0 remains indefinite X. That is, the signal which has a definite value in practical operation is indefinite in logic simulation.

To overcome such a shortcoming, the conventional logic simulator comprises definite value setting means for forcing the DFF 33 or DFF 34 to return to a definite value by the reset signal RST for logic simulation independently of the necessity thereof in the practical circuit.

The conventional logic simulator is disadvantageous in that the circuit to be simulated, once having outputted an indefinite value, keeps outputting the indefinite value in logic simulation although the circuit surely outputs a definite value after a predetermined period has elapsed since it outputted the indefinite value in practical operation.

For a solution of the problem, it is necessary to additionally provide the definite value setting means for forcing the output of the logic circuit to return to a definite value such as the reset circuit, as above mentioned.

The result is the production of the definite value setting means that is required only in logic simulation in the fabrication of the circuit to be simulated as a practical logic circuit. This results in an increased circuit scale and a cumbersome step of applying an external signal for controlling the added definite value setting means, leading to a reduction in degree of integration and efficiency of the logic circuit to be practically fabricated.

SUMMARY OF THE INVENTION

According to the present invention, a logic simulator comprises: net list providing means for providing a net list specifying devices forming a circuit to be simulated and connection between the devices; macro cell data providing means for providing macro cell data specifying various macro cells performing basic logical actions; test pattern providing means for providing an input test pattern including time series data of an external input signal for logic simulation; and simulation executing means receiving the net list, the macro cell data and the input test pattern for executing logic simulation on the circuit for each macro cell on the basis of the input test pattern, the simulation executing means receiving an input of a macro cell in the form of a logical expression to perform a logical operation when the input has an indefinite value.

Preferably, the simulation executing means includes: signal change detecting means receiving the net list and the input test pattern for detecting a change of the external input signal given from the input test pattern and a change of an internal signal between the macro cells in the circuit to output signal detection information; and logical action analyzing means receiving the net list, the macro cell data and the signal detection information for analyzing a logical action for each macro cell specified by the macro cell data for the circuit on the basis of the signal changes given from the signal detection information, the logical action analyzing means receiving an input of a macro cell in the form of a logical expression based on an input signal of its immediately preceding macro cell to perform a logical operation when the input has an indefinite value.

The simulation executing means of the logic simulator of the present invention accepts the input of a macro cell in the form of the logical expression to perform the logical operation if the input has the indefinite value during the execution of logic simulation. The logical operation based on the logical expression permits a predetermined probability of the provision of a definite value.

As a result, the necessity is eliminated to provide a surplus circuit such as a reset circuit for forcing the output of a macro cell outputting the indefinite value to be set to a definite value. This increases the degree of integration and efficiency of the logic circuit to be practically fabricated after the logic simulation.

In another aspect of the present invention, the logic simulator comprises: net list providing means for providing a net list specifying devices forming a circuit to be simulated and connection between the devices; macro cell data providing means for providing macro cell data specifying various macro cells performing basic logical actions, the macro cell data providing means specifying at least a sequential circuit device as a macro cell; test pattern providing means for providing an input test pattern including time series data of an external input signal for logic simulation; sequential circuit device searching means receiving the net list and the macro cell data for searching the circuit for a sequential circuit device to output a search result in the form of sequential circuit device information; feedback sequential circuit device extracting means receiving the net list and the sequential circuit device information for extracting a sequential circuit device given from the sequential circuit device information and having a feedback loop to output feedback sequential circuit device information specifying the extracted sequential circuit device as a feedback sequential circuit device; and simulation executing means receiving the net list, the macro cell data, the input test pattern and the feedback sequential circuit device information for executing logic simulation on the circuit for each macro cell on the basis of the input test pattern, the simulation executing means, when an output of the feedback sequential circuit device has an indefinite value, replacing the indefinite value with n divided determinable virtual definite values (n≧2) and executing the logic simulation based on the n virtual definite values in parallel for determination of logical operation results, to output the logical operation results to the output of the feedback sequential circuit device when all of the logical operation results based on the n divided virtual definite values are equal.

In a third aspect of the invention, the logic simulator comprises: net list providing means for providing a net list specifying devices forming a circuit to be simulated and connection between the devices; macro cell data providing means for providing macro cell data specifying various macro cells performing basic logical actions, the macro cell data providing means specifying at least a sequential circuit device as a macro cell; test patten providing means for providing an input test pattern including time series data of an external input signal for logic simulation; feedback sequential circuit device information providing means for providing feedback sequential circuit device information specifying a sequential circuit device forming the circuit and having a feedback loop as a feedback sequential circuit device; and simulation executing means receiving the net list, the macro cell data, the input test pattern and the feedback sequential circuit device information for executing logic simulation on the circuit for each macro cell on the basis of the input test pattern, the simulation executing means, when an output of the feedback sequential circuit device has an indefinite value, replacing the indefinite value with n divided determinable virtual definite values (n≧2) and executing the logic simulation based on the n virtual definite values in parallel for determination of logical operation results, to set the output of the feedback sequential circuit device to the logical operation results when all of the logical operation results based on the n divided virtual definite values are equal.

Preferably, the simulation executing means includes: signal change detecting means receiving the net list and the input test pattern for detecting a change of the external input signal given from the input test pattern and a change of an internal signal between the macro cells in the circuit to output signal detection information; sequential circuit device state setting means receiving the signal detection information and the feedback sequential circuit device information and, on detection of an indefinite value output feedback sequential circuit device outputting an indefinite value among the feedback sequential circuit devices, for dividing the indefinite value from the indefinite value output feedback sequential circuit device into n replaceable virtual definite values, to thereby set n virtual states; logical action analyzing means receiving the net list, the macro cell data and the signal detection information for analyzing a logical action for each macro cell specified by the macro cell data for the circuit on the basis of the signal changes given from the signal detection information, the logical action analyzing means analyzing the logical action for the n virtual states of the indefinite value output feedback sequential circuit device, if found; and sequential circuit device output determining means receiving the logical action analysis results for the n virtual states of the indefinite value output feedback sequential circuit device by the logical action analyzing means for setting the output of the indefinite value output feedback sequential circuit device to the logical action analysis results when all of the logical action analysis results for the n virtual states are equal.

The simulation executing means of the logic simulator of the second and third aspects, when the output of the feedback sequential circuit device has an indefinite value, replaces the indefinite value with n divided determinable virtual definite values (n≧2) and performing logic simulation for the n virtual definite values in parallel to determine the logical operation results. When all of the logical operation results for the n divided virtual definite values are equal, the logical operation results are set to the output of the feedback sequential circuit device. While the feedback sequential circuit device has the property of outputting a predetermined definite value after a predetermined time period has elapsed since it outputted any value, an indefinite value outputted from the feedback sequential circuit device is permitted to return to the definite value.

As a result, the necessity is eliminated to provide a surplus circuit such as a reset circuit for forcing the output of the sequential circuit device outputting the indefinite value to be set to a definite value, thereby increasing the degree of integration and efficiency of the logic circuit to be practically fabricated after the logic simulation.

The logic simulator of the third aspect comprises the feedback sequential circuit device information providing means which provides the feedback sequential circuit device information specifying as the feedback sequential circuit device the sequential circuit device forming the circuit to be simulated and having the feedback loop. This permits previous exclusion from consideration the grouped sequential circuit devices in the feedback loop which will not output any definite values, thereby achieving logic simulation in a shorter time.

An object of the present invention is to provide a logic simulator which is capable of executing logic simulation without reduction in degree of integration and efficiency of a logic circuit to be practically fabricated.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
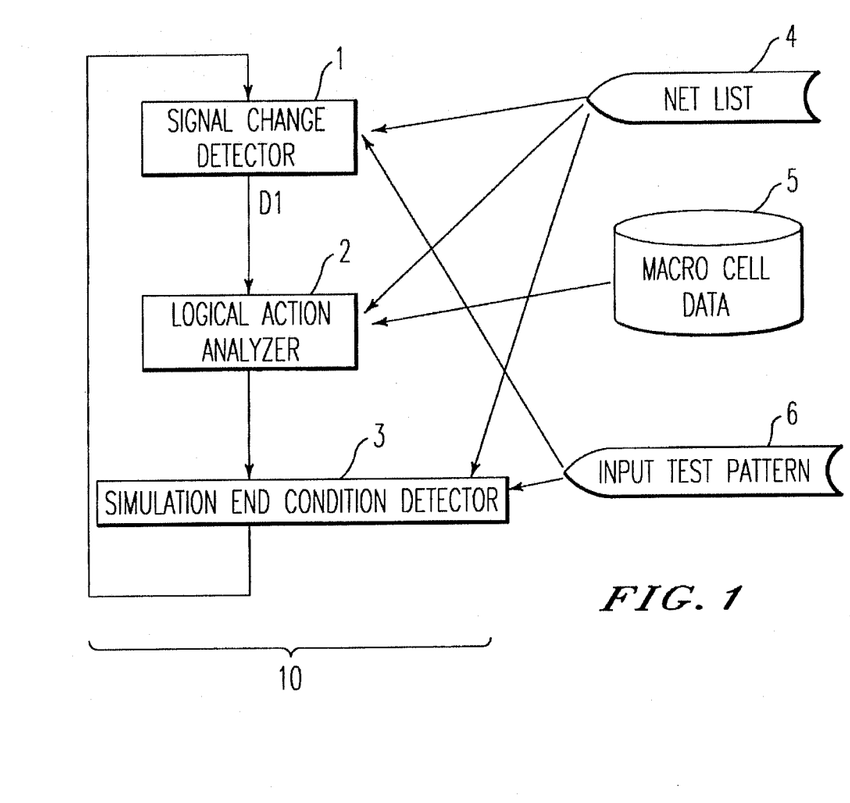
FIG. 1 is a block diagram of a logic simulator according to a first preferred embodiment of the present invention.

FIG. 1 is a block diagram of a logic simulator according to a first preferred embodiment of the present invention.

Referring to FIG. 1, a simulation executing portion 10 comprises a signal change detector 1, a logical action analyzer 2, and a simulation end condition detector 3. Net list providing means (not shown) applies a net list 4 including information specifying devices forming a logic circuit to be logic-simulated and connection between the devices to the signal change detector 1, logical action analyzer 2 and simulation end condition detector 3.

Macro cell data providing means (not shown) applies, to the logical action analyzer 2, macro cell data 5 specifying information of logical function blocks (macro cells) for executing basic logical actions. Input test pattern providing means (not shown) applies an input test pattern 6 including time series data of external input signals for logic simulation to the signal change detector 1 and simulation end condition detector 3. The macro cell data providing means can be memory means including the macro cell data 5 in the form of a data base.

The signal change detector 1 receives the net list 4 and the input test pattern 6, and detects a change of the external input signals given from the input test pattern 6 and a change of an internal signal between the macro cells in the circuit to be simulated at a current simulation time, to output signal detection information D1 to the logical action analyzer 2.

The logical action analyzer 2 receives the net list 4 and the macro cell data 5, and performs logical action analysis on the circuit to be simulated with logical expression arithmetic operation to be described later in detail on the basis of the signal changes given from the signal detection information of the signal change detector 1.

The simulation end condition detector 3 is enabled to calculate a logic simulation end time on the basis of the net list 4 and the input test pattern 6, or to obtain the logic simulation end time in consideration for a signal propagation time based on the net list 4 from the input end of the input test pattern. The simulation end condition detector 3 updates a simulation time to detect whether or not the updated simulation time is equal to the logic simulation end time. If judged that the updated simulation time is equal to the logic simulation end time, the logic simulation is completed. If not, the simulation end condition detector 3 applies the updated simulation time to the signal change detector 1, and the logic simulation is continued.

Figure 2:
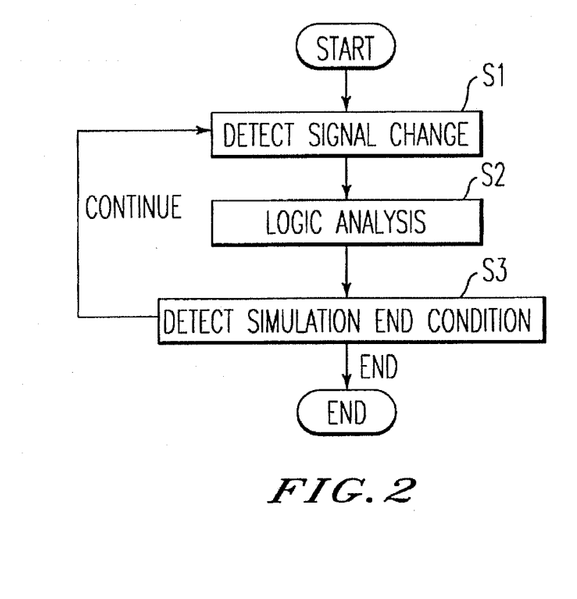
FIGS. 2 and 3 are flow charts illustrating the operation of the logic simulator of the first preferred embodiment.

FIG. 2 is a flow chart illustrating the logic simulation of the logic simulator of the first preferred embodiment.

Referring to FIG. 2, in the step S1, the signal change detector 1 detects the external input signal change and the internal signal change at the current simulation time on the basis of the net list 4 and the input test pattern 6, to output the signal detection signal D1 to the logical action analyzer 2.

In the step S2, the logical action analyzer 2 analyzes the logical action of a macro cell which has a changed input signal on the basis of the signal detection information given from the signal change detector 1.

Figure 3:
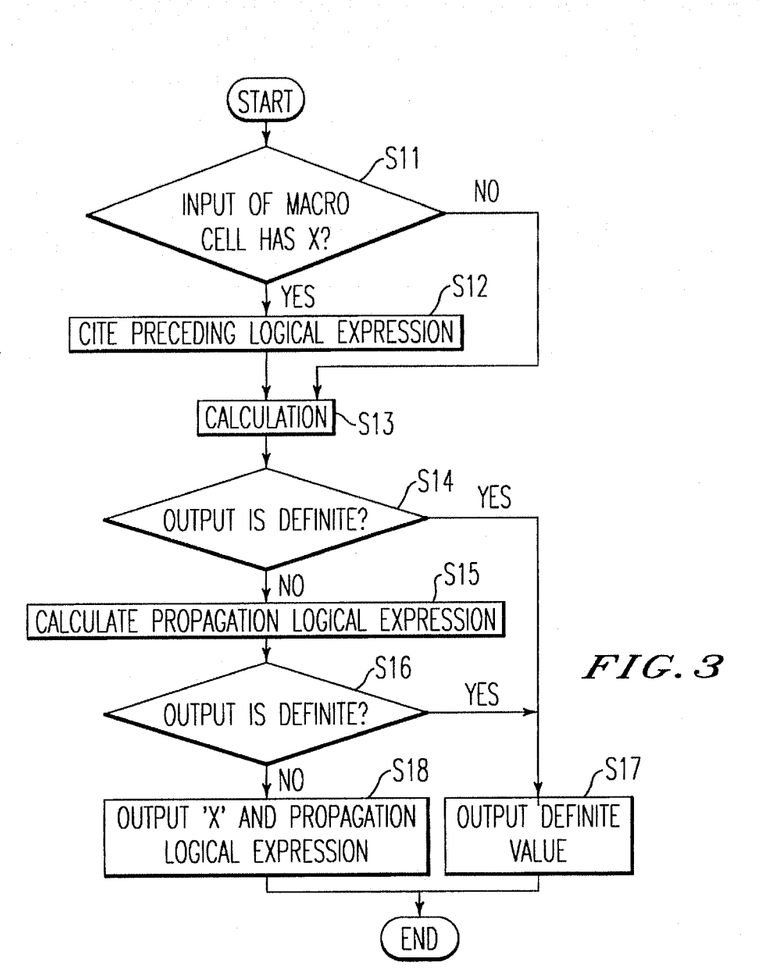
Figure 4:
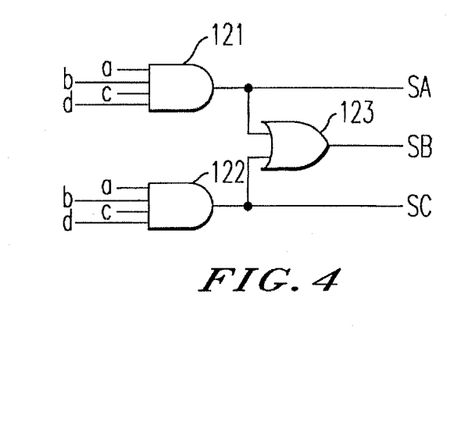
FIG. 4 is a circuit diagram for delineating the operation of the logic simulator of the first preferred embodiment.

FIG. 3 is a flow chart illustrating the details of the logic analysis of the step S2. FIG. 4 is a circuit diagram of an exemplary combinational circuit for delineating the logic analysis. The combinational circuit of FIG. 4 will be described below.

As shown in FIG. 4, a 4-input AND gate 121 receives input signals a to d to output a signal SA, which is also applied to a first input of an OR gate 123. An AND gate 122 receives the input signals a to c and an input signal $\bar{d}$ which is the inverted signal of the signal d to output a signal SC, which is also applied to a second input of the OR gate 123. The OR gate 123 outputs a signal SB. It should be noted that the AND gates 121, 122 and OR gate 123 of FIG. 4 are combinational circuits.

Referring now to FIG. 3, a description will be given on the logical action analysis of the logical action analyzer 2 using the combinational circuit of FIG. 4 as an example. The analysis is performed for each macro cell, that is, for each gate 121, 122, 123 in the combinational circuit of FIG. 4.

The presence of an indefinite value X in the input signal of a macro cell is verified in the step S11. The flow continues into the step S12 if an indefinite value X is present, and the flow continues into the step S13 if it is absent.

In the step S12 is cited a propagation logical expression (to be described later in detail) outputted together with the indefinite value X of the preceding macro cell. For example, when the OR gate 123 is of current interest of logical action analysis, one of the input signals SA and SC thereof which has the indefinite value X is replaced with a propagation logical expression outputted from the preceding macro cell (the AND gate 121 or the AND gate 122).

The logical operation is performed on the target macro cell for the logical action analysis in the step S13. At that time, when them is an indefinite value X in the input of the macro cell, the operation is performed based on the propagation logical expression substituted for the indefinite value X.

In the step S14 it is verified whether the output of the macro cell (result of operation) is definite. If definite, the definite value is outputted in the step S17, and the processing is completed. If indefinite, the flow continues into the step S15.

In the step S15, the propagation logical expression is calculated for the macro cell of the logical action analysis target. For example, the propagation logical expression of the AND gate 121 is calculated in the form of a logical expression d where the AND gate 121 is the target and the input signals a to c are "1" while the input signal d being indefinite X.

In the step S16 it is verified whether the output of the propagation logical expression calculated in the step S15 is definite. If definite, the definite value is outputted in the step S17, and the processing is completed.

If indefinite in the step S16, a set of the indefinite value X and the propagation logical expression determined in the step S15 are transmitted as the output of the macro cell to the succeeding macro cell, and the processing is completed.

An example of the logical action analysis for the circuit of FIG. 4 will be discussed below wherein the input signals a to c are "1" while the input signal d ($\bar{d}$) is indefinite X and the order of the analysis is the AND gate 121, the AND gate 122 and the OR gate 123. The propagation logical expression of the input signal d is represented as d, and the propagation logical expression of the inverted input signal $\bar{d}$ is represented as $\bar{d}$.

A first macro cell to be subjected to the logical action analysis is the AND gate 121.

Since there is an indefinite value X in the input signal d of the AND gate 121, the flow shifts from the step S11 into the step S12 in which the propagation logical expression d of the input signal d is cited.

The logical operation of the AND gate 121 is performed in the step S13. The result of the logical operation is indefinite X since the input signal d has the indefinite value X.

Then the flow shifts from the step S14 into the step S15 in which the propagation logical expression is calculated, so that the propagation logical expression of the AND gate 121 is the logical expression d as described above.

The flow shifts from the step S16 into the step S18 because of the logical expression d being indefinite. In the step S18, a set of the indefinite value X and the propagation logical expression d are outputted as the output of the AND gate 121, and the procedure is completed.

The AND gate 122 is then a second macro cell to be subjected to the logical action analysis.

Since there is an indefinite value X in the inverted input signal $\bar{d}$ of the AND gate 122, the flow shifts from the step S11 into the step S12 in which the propagation logical expression $\bar{d}$ of the inverted input signal $\bar{d}$ is cited.

The logical operation of the AND gate 122 is performed in the step S13. The result of the logical operation is indefinite X since the inverted input signal $\bar{d}$ has the indefinite value X.

Then the flow shifts from the step S14 into the step S15 in which the propagation logical expression is calculated, so that the propagation logical expression of the AND gate 122 is the logical expression $\bar{d}$ in the same manner as the AND gate 121.

Since the logical expression $\bar{d}$ is indefinite, the flow shifts from the step S16 into the step S18 in which the indefinite value X and the propagation logical expression $\bar{d}$ are outputted as the output of the AND gate 122, and the procedure is completed.

The OR gate 123 is then a third macro cell to be subjected to the logical action analysis.

Since there is an indefinite value X in the first and second inputs of the OR gate 123, the flow shifts from the step S11 into the step S12 in which the propagation logical expression d is cited for the first input whereas the propagation logical expression $\bar{d}$ is cited for the second input.

The logical operation of the OR gate 123 is performed in the step S13. Then the logical sum of the logical expression d for the first input and the logical expression $\bar{d}$ for the second input is a definite value "1".

The flow accordingly shifts from the step S14 into the step S17 in which the definite value "1" is outputted as the output of the OR gate 123, and the procedure is completed.

There is a predetermined probability of the definite value determined by the logical operation with the propagation logical expression in response to the input of the indefinite value X.

Referring again to FIG. 2, the step S3 follows the step S2.

In the step S3, the simulation end condition detector 3 updates the simulation time to detect whether the updated simulation time is equal to the logic simulation end time. If judged that the updated simulation time is equal to the logic simulation end time, the logic simulation is completed. If not, the simulation end condition detector 3 judges that it indicates the continuation of the logic simulation and applies the updated simulation time to the signal change detector 1. The flow then returns to the step S1.

The steps S1 to S3 are repeated until the logic simulation end is determined in the step S3.

The execution of the logical operation using the propagation logical expression in place of the indefinite value X when the macro cell receives the input signal having the indefinite value X, permits the predetermined probability of the determination of the logical operation in response to the indefinite input, which has not been heretofore obtainable.

The necessity is, consequently, eliminated to provide a surplus circuit such as the reset circuit for forcing the output of the macro cell which is indefinite X to be set to the definite value for logic simulation.

This enables the logic simulation to be executed on the logic circuit including practically necessary components, achieving an increase in degree of integration and efficiency resulting from circuit scale reduction and less external signals of the logic circuit to be practically fabricated after the logic simulation.

<Second Preferred Embodiment>

Figure 5:
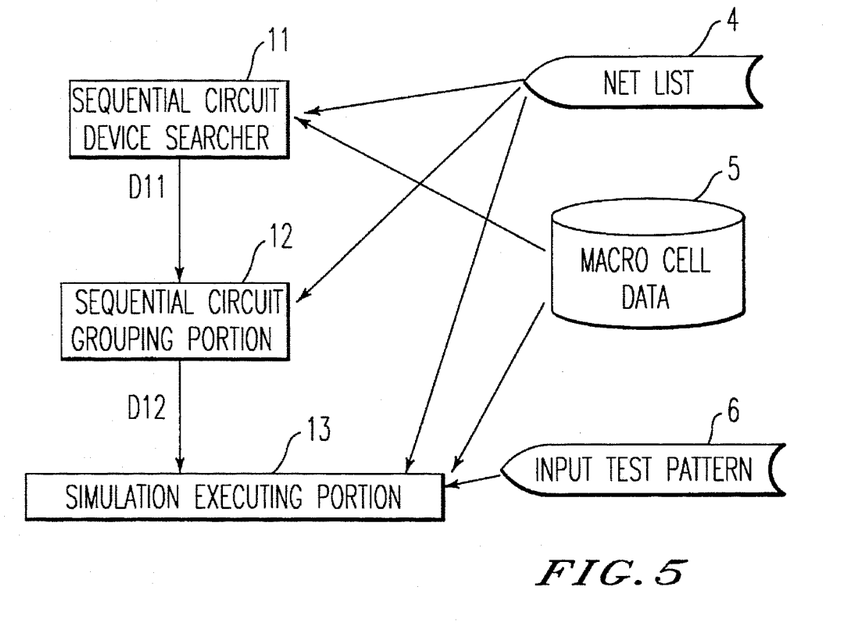
FIG. 5 is a block diagram of the logic simulator according to a second preferred embodiment of the present invention.

FIG. 5 is a block diagram of the logic simulator according to a second preferred embodiment of the present invention.

Referring to FIG. 5, the net list providing means (not shown) applies the net list 4 including the information specifying the devices forming the circuit to be simulated and connection between the devices to a sequential circuit device searcher 11, a sequential circuit grouping portion 12, and a simulation executing portion 13. The macro cell data providing means (not shown) applies the macro cell data 5 specifying the macro cell information including sequential circuit device information to the sequential circuit device searcher 11 and simulation executing portion 13. The input test pattern providing means (not shown) applies the input test pattern 6 to the simulation executing portion 13. The macro cell data providing means may be memory means including the macro cell data 5 in the form of a data base.

The sequential circuit device searcher 11 searches the net list 4 for a sequential circuit device such as a flip-flop with reference to the macro cell data 5, and outputs the resultant sequential circuit device information D11 to the sequential circuit grouping portion 12. Information of reference for judging whether macro cells forming the circuit to be simulated are sequential circuit devices or not is given from the macro cell data 5.

The sequential circuit grouping portion 12 accepts the sequential circuit devices given from the sequential circuit device information D11 and groups one or more sequential circuit devices or sequential circuit device sets having the same feedback loop to output grouped sequential circuit device information D12 to the simulation executing portion 13. That is, the sequential circuit grouping portion 12 forms into a group a sequential circuit device set including a plurality of sequential circuit devices which share a feedback loop as well as a single sequential circuit device having a feedback loop. The sequential circuit grouping portion 12 then outputs to the simulation executing portion 13 the grouped sequential circuit device information 12 specifying the single sequential circuit device having a feedback loop and the set of sequential circuit devices sharing a feedback loop as grouped sequential circuit devices.

The simulation executing portion 13 performs logic simulation on the circuit specified by the net list 4 on the basis of the input test pattern 6. In this case, a division logic simulation to be described later is executed on the grouped sequential circuit devices specified by the grouped sequential circuit device information D12.

Figure 6:
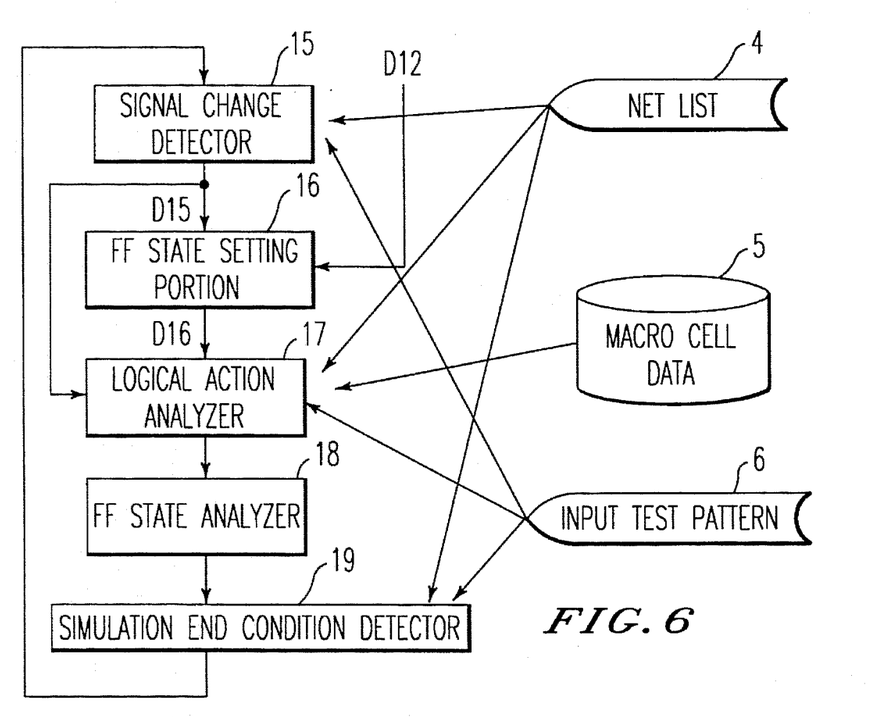
FIG. 6 is a block diagram showing the details of a simulation executing portion of the logic simulator of the second preferred embodiment.

FIG. 6 is a block diagram showing the details of the simulation executing portion 13 of FIG. 5.

Referring to FIG. 6, the net list providing means (not shown) applies the net list 4 to a signal change detector 15, a logical action analyzer 17 and a simulation end condition detector 19.

The macro cell data providing means (not shown) applies the macro cell data 5 to the logical action analyzer 17. The input test pattern providing means (not shown) applies the input test pattern 6 to the signal change detector 15, the logical action analyzer 17 and the simulation end condition detector 19.

The signal change detector 15 receives the net list 4 and the input test pattern 6 and detects a change of the external input signals from the input test pattern 6 and an internal signal change between the macro cells in the circuit to be simulated at the current simulation time, to output the signal detection information to an FF state setting portion 16.

The FF state setting portion 16 detects the sequential circuit device (FF) which outputs the indefinite value X from the grouped sequential circuit devices as an indefinite holding FF on the basis of signal detection information D15 and grouped sequential circuit device information D12, and performs a dividing processing such that the indefinite value X outputted from the detected indefinite holding FF is replaced with all states of determinable definite values of the output of the indefinite holding FF. Then the FF state setting portion 16 outputs divided sequential circuit device information D16 to the logical action analyzer 17.

The logical action analyzer 17 receives the signal detection information D15, the divided sequential circuit device information D16, the net list 4, and the macro cell data 5 and performs logical action analysis on the circuit to be simulated on the basis of the signal detection information D15. For the indefinite holding FF, the logical action analysis is carried out using all of the divided definite values on the basis of the divided sequential circuit device information D16.

An FF state analyzer 18 analyzes the divided output states of the indefinite holding FF from the logical action analysis result of the logical action analyzer 17, and verifies whether all of the divided output signals of the indefinite holding FF are equal or not. If they are all equal, setting of the dividing for the indefinite holding FF is released and the equal signal value is used thereafter. If they are not equal even partially, setting of the dividing is maintained.

The simulation end condition detector 19 is enabled to calculate the logic simulation end time on the basis of the net list 4 and the input test pattern 6, or to obtain the logic simulation end time in consideration for the signal propagation time based on the net list 4 from the input end of the input test pattern. The simulation end condition detector 19 updates the simulation time to detect whether or not the updated simulation time is equal to the logic simulation end time. If judged that the updated simulation time is equal to the logic simulation end time, the logic simulation is completed. If not, the updated simulation time is applied to the signal change detector 15, and the logic simulation is continued.

Figure 7:
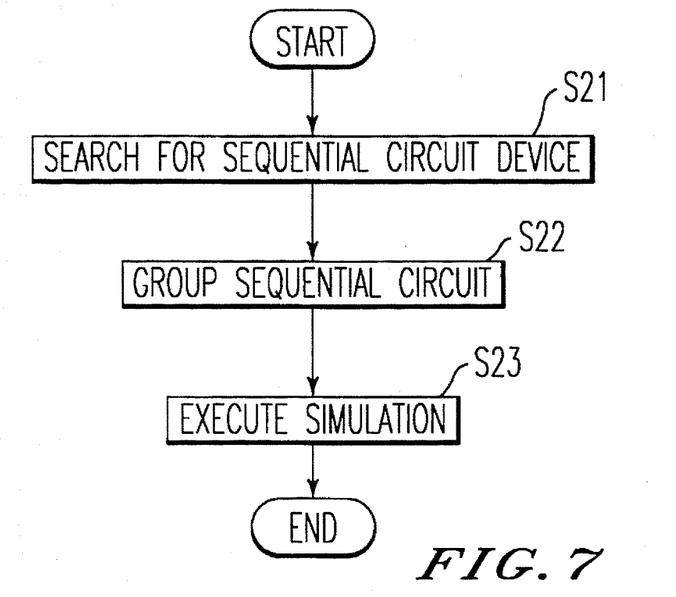
FIGS. 7 to 9 are flow charts illustrating the operation of the logic simulator of the second preferred embodiment.
Figure 8:
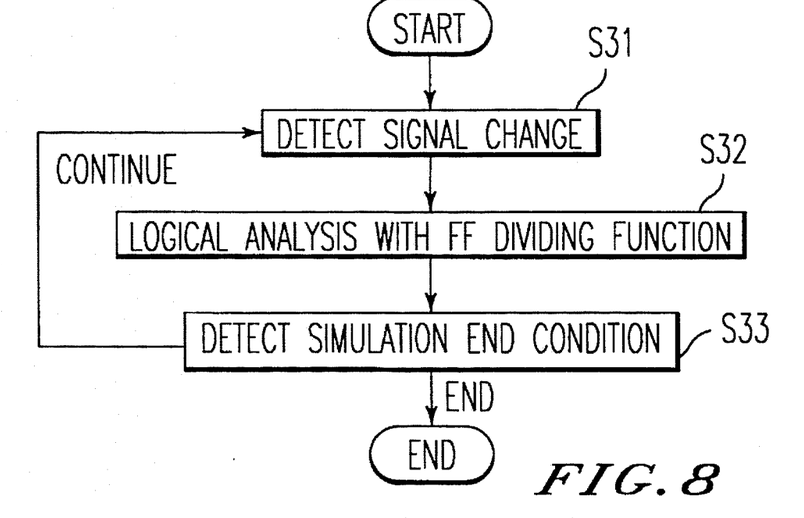
Figure 9:
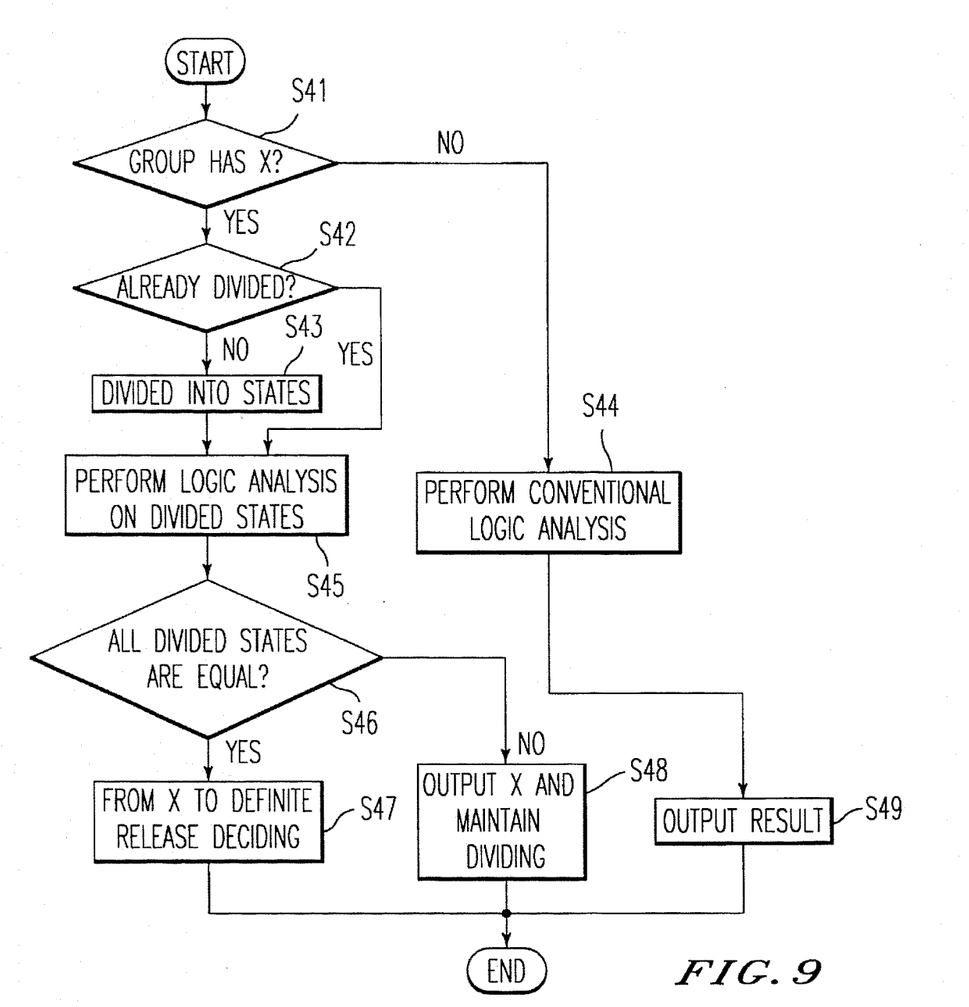
Figure 10:
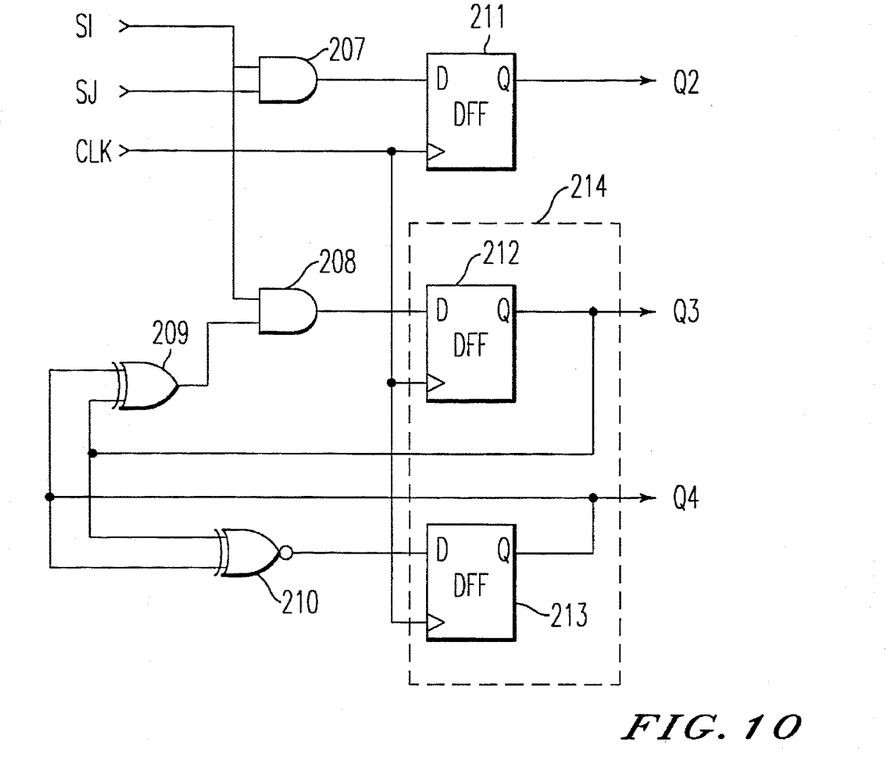
FIG. 10 is a circuit diagram for delineating the operation of the logic simulator of the second preferred embodiment.

FIGS. 7 to 9 are flow charts showing the logic simulation of the logic simulator of the second preferred embodiment. FIG. 10 is a circuit diagram of an exemplary circuit to be simulated including the DFFs which are sequential circuit devices. The circuit diagram of FIG. 10 will be described hereinafter.

An input signal SI is applied to first inputs of AND gates 207 and 208 in common, as shown in FIG. 10, and an input signal SJ is applied to a second input of the AND gate 207. A clock signal CLK is applied to clock inputs of DFFs 211 to 213 in common.

The output of the AND gate 207 is given to a D-input of the DFF 211. A Q-output Q2 of the DFF 211 is outputted to the outside. The output of the AND gate 208 is given to a D-input of the DFF 212. A Q-output Q3 of the DFF 212 is outputted to the outside and is also applied to first inputs of an exclusive-OR gate 209 and an exclusive-NOR gate 210 in common. A Q-output Q4 of the DFF 213 is outputted to the outside and is also applied to second inputs of the exclusive-OR gate 209 and exclusive-NOR gate 210 in common. The output of the exclusive-OR gate 209 is given to a second input of the AND gate 208, and the output of the exclusive-NOR gate 210 is given to a D-input of the DFF 213.

With reference to FIGS. 7 to 9, description will be given on the logic simulation for the logic circuit of FIG. 10 to be simulated.

In the step S21, the sequential circuit device searcher 11 searches the net list 4 for a sequential circuit device such as a flip-flop with reference to the macro cell data 5, to output the resultant sequential circuit device information D11 to the sequential circuit grouping portion 12.

For the circuit to be simulated of FIG. 10, for example, the DFFs 211 to 213 are recognized as the sequential circuit devices. Thus information specifying the DFFs 211 to 213 as the sequential circuit devices in the circuit of FIG. 10 is the sequential circuit device information D11.

In the step S22, the sequential circuit grouping portion 12 forms into a group the sequential circuit device or sequential circuit device set having the same feedback loop as a grouped sequential circuit device to output the grouped sequential circuit device information D12 to the simulation executing portion 13.

For the circuit to be simulated of FIG. 10, for example, the DFF 211 is not grouped as DFF 211 does not have such a feedback loop that the Q-output Q2 is fed back to the D-input. This is because the DFF 211 continues outputting the Q-output Q2 having the indefinite value X until a definite value is given to the D-input thereof.

The DFF 212, on the other hand, has the Q-output Q3 fed back to the D-input thereof through the exclusive-OR gate 209 and the AND gate 208, so that it has a feedback loop and is to be grouped. In addition, the DFF 212 has another feedback loop passing through the DFF 213 since the output of the DFF 212 is fed back to the D-input thereof through the exclusive-NOR gate 210, DFF 213, exclusive-OR gate 209 and AND gate 208.

The DFF 213 whose Q-output Q4 is fed back to the D-input thereof through the exclusive-NOR gate 210 has a feedback loop and is to be grouped. In addition, the DFF 213 has another feedback loop passing through the DFF 212 since the output of the DEF 213 is fed back to the D-input thereof through the exclusive-OR gate 209, AND gate 208, DFF 212 and exclusive-NOR gate 210.

It is judged that the DFFs 212 and 213 share a feedback loop in such a case that the DFF 213 lies on the feedback loop of the DFF 212 and the DFF 212 lies on the feedback loop of the DFF 213. The DFFs 212 and 213 are grouped together into a grouped FF set 214.

In the step S23, the logic simulation is executed on the circuit to be simulated on the basis of the input test pattern 6. The division logic simulation is executed on the grouped sequential circuit devices specified by the grouped sequential circuit device information D12.

Details of the operation of the step S23 will be described below with reference to FIG. 8.

In the step S31, the signal change detector 15 detects changes of the external input signals and internal signal at the current simulation time on the basis of the net list 4 and input test pattern 6, to output the signal detection information D15 to the FF state setting portion 16 and FF state analyzer 18.

In the step S32, the FF state setting portion 16, logical action analyzer 17 and FF state analyzer 18 perform the logical analysis with FF dividing function on a macro cell having a changed input signal on the basis of the signal detection information D15 from the signal change detector 15.

FIG. 9 is a flow chart showing the details of the logical analysis with FF dividing function of the step S32. Referring to FIG. 9, description will be given on the logical action analysis, for example, for the circuit to be simulated of FIG. 10 by the FF state setting portion 16, logical action analyzer 17 and FF state analyzer 18.

In the step S41, the FF state setting portion 16 detects the sequential circuit device (FF) outputting the indefinite value X from the grouped sequential circuit devices as the indefinite holding FF on the basis of the signal detection information given in the step S31 and the grouped sequential circuit device information D12. If an indefinite holding FF is detected, the flow continues into the step S42. If not detected, the flow continues into the step S44 for processing by the logical action analyzer 17.

For the circuit to be simulated of FIG. 10, for example, because of the presence of the grouped FF set 214, the judgement in the step S41 is YES when the Q-output Q3 of the DFF 212 or the Q-output Q4 in the grouped FF set 214 is indefinite X.

The FF state setting portion 16 verifies whether the indefinite holding FF has been subjected to the dividing processing in the step S42. If not, the dividing processing is performed in the step S43 such that the indefinite value X outputted from the indefinite holding FF is replaced with virtual definite values including all states of determinable definite values of the output of the indefinite holding FF. The FF state setting portion 16 then outputs the divided sequential circuit device information D16. The flow then continues into the step S45. If the dividing processing has been subjected to the indefinite holding FF in the step S42, the flow directly shifts into the step S45 without passing by way of the step S43.

Figure 11:
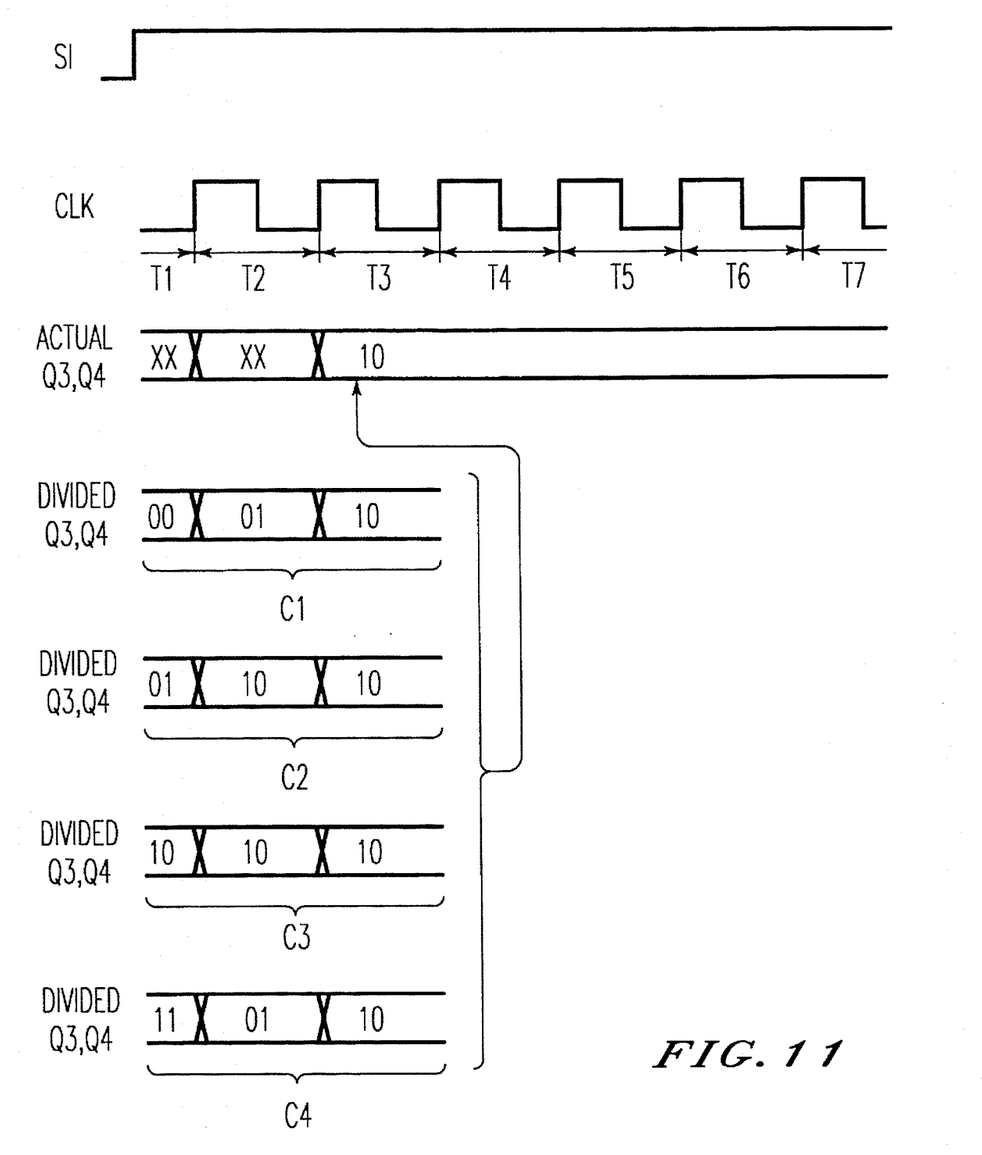
FIG. 11 is a waveform chart for delineating the operation of the logic simulator of the second preferred embodiment.

For the circuit to be simulated of FIG. 10, for example, the Q-outputs Q3 and Q4 of the DFFs 212 and 213 of the grouped FF set 214, if having the indefinite value X, provide four determinable definite value states (Q3, Q4)=(0, 0), (0, 1), (1, 0), (1, 1) during a time period T1 corresponding to the current simulation time, as shown in FIG. 11. Thus the Q-outputs Q3 and Q4 are subjected to the dividing processing into the following states: C1{=(0, 0)}, C2{=(0, 1)}, C3{=(1, 0)}, C4{=(1, 1)} in the form of the virtual definite values in the step S43.

In the step S45, the logical action analyzer 17 accepts the net list 4 and the macro cell data 5 and performs the logical action analysis on the circuit to be simulated on the basis of the signal detection information D15 from the signal change detector 15. At that time, the indefinite holding FF is subjected to the logical action analysis using all of the divided definite values on the basis of the divided sequential circuit device information D16.

In the circuit of FIG. 10, for example, when the Q-outputs Q3 and Q4 of the DFFs 212 and 213 of the grouped FF set 214 which are the indefinite holding FF are divided into the states C1 to C4 during the time period T1 as shown in FIG. 11, the logical action analysis is effected in parallel for the states C1 to C4.

If the judgement is NO in the step S41, the flow continues into the step S44. Since there is no indefinite holding FF at the current simulation time, the logical action analyzer 17 accepts the net list 4 and the macro cell data 5 and performs the conventional logical action analysis on the circuit to be simulated. The flow then continues into the step S49.

In the step S46 immediately following the step S45, the FF state analyzer 18 analyzes the divided output states of the indefinite holding FF on the basis of the logical action analysis result of the step S45 and verifies whether or not all of the divided output signals of the indefinite holding FF are equal.

If the judgement is YES in the step S46, then the FF state analyzer 18 replaces the equal output signal value with the actual definite value outputted from the indefinite holding FF in the step S47 and setting of the dividing is released. This completes the procedure.

If the judgement is NO in the step S46, then the FF state analyzer 18 maintains the actual output state of the indefinite holding FF with the indefinite value X and also maintains the setting of the dividing. This completes the procedure.

In the circuit to be simulated of FIG. 10, for example, (Q3, Q4)=(0, 1) for the states C1 and C4 and (Q3, Q4)=(1, 0) for the states C2 and C3 where the current simulation time is the time period T2. The signal changes (states) based on the divided definite values are not all equal, so that the judgement is NO in the step S46. Then the actual indefinite value X of the Q-outputs Q3 and Q4 and the setting of the dividing into the states C1 to C4 are maintained in the step S48.

Where the current simulation time is the time period T3, (Q3, Q4)=(1, 0) for all of the states C1 to C4 in the circuit of FIG. 10. All of the divided output signals of the indefinite FF are equal. The judgement is YES in the step S46, and the actual indefinite value X of the Q-outputs Q3 and Q4 is replaced with (1, 0) in the step S47, releasing the setting of the dividing into the states C1 to C4.

In the step S49 immediately following the step S44, the FF state analyzer 18 outputs the logical analysis result of the step S44 as it is, and the procedure is completed.

Referring again to FIG. 8, the step S33 follows the step S32.

In the step S33, the simulation end condition detector 19 updates the simulation time and detects whether or not the updated simulation time is equal to the logic simulation end time. If judged that the updated simulation time is equal to the logic simulation end time, the logic simulation is completed. If not, the judgement is the continuation of the logic simulation, and the simulation end condition detector 19 applies the updated simulation time to the signal change detector 15. The flow returns to the step S31.

The steps S31 to S33 are repeated until the judgement of the logic simulation end in the step S33.

As above described, the indefinite value X if outputted from the sequential circuit device (FF) having a feedback loop is replaced with all determinable definite values for the indefinite value X by the dividing processing, and logical analysis is performed in parallel for the respective divided states. This provides a predetermined probability of the logical check determined based on an indefinite input, which has not been heretofore attainable.

As a result, the need is eliminated to provide a surplus circuit for forcing the output of the sequential circuit device which is indefinite X to be set to the definite value such as a reset circuit for logic simulation.

Logic simulation may be performed on the logic circuit including practically necessary components, thereby increasing the degree of integration and efficiency resulting from reduction in circuit scale and in the number of external signals for the logic circuit to be fabricated practically after the logic simulation.

<Third Preferred Embodiment>

Figure 12:
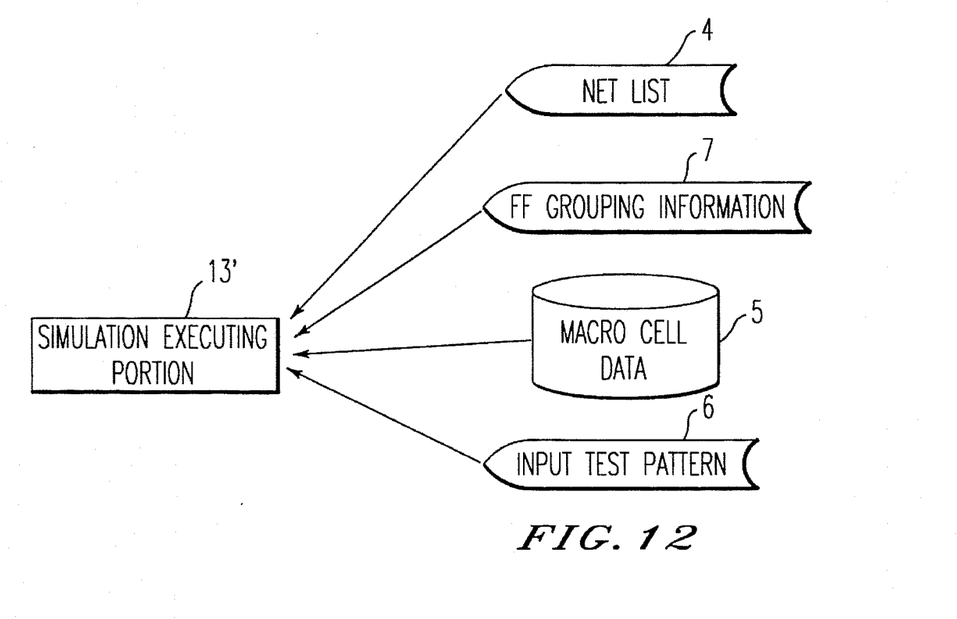
FIG. 12 is a block diagram of the logic simulator according to a third preferred embodiment of the present invention.

FIG. 12 is a block diagram of the logic simulator according to a third preferred embodiment of the present invention.

Referring to FIG. 12, the net list providing means (not shown) applies the net list 4 to a simulation executing portion 13'. The macro cell data providing means (not shown) applies the macro cell data 5 to the simulation executing portion 13'. The input test pattern providing means (not shown) applies the input test pattern 6 to the simulation executing portion 13'.

FF grouping information providing means (not shown) applies FF grouping information 7 to the simulation executing portion 13'.

The FF grouping information 7 is initially provided manually or otherwise by grouping one or more sequential circuit devices having a feedback loop which might output a definite value after a predetermined time period has elapsed since they outputted the indefinite value X in the circuit to be simulated specified by the net list 4. The basis of the grouping of the third preferred embodiment is the same as that of the grouping in the sequential circuit grouping portion 12 of the second preferred embodiment.

The simulation executing portion 13' performs logic simulation on the circuit specified by the net list 4 on the basis of the input test pattern 6. At that time, the division logic simulation is executed on the grouped sequential circuit devices specified by the FF grouping information 7 in the same manner as the simulation executing portion 13 of the second preferred embodiment.

Figure 13:
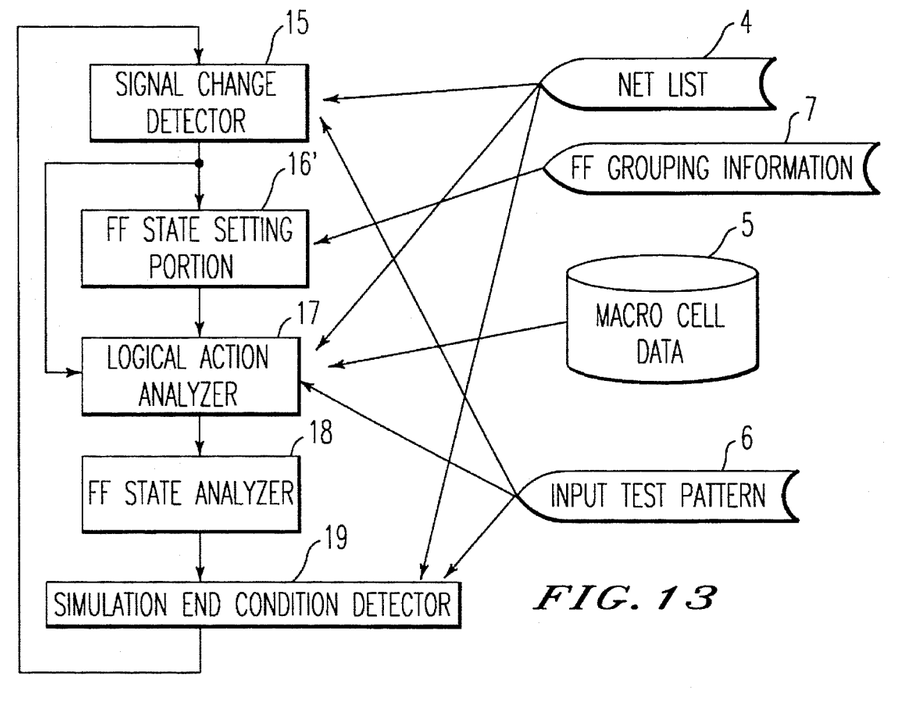
FIG. 13 is a block diagram showing the details of the simulation executing portion of the logic simulator of the third preferred embodiment.

FIG. 13 is a block diagram showing the details of the simulation executing portion 13' of FIG. 12.

Referring to FIG. 13, FF grouping information providing means (not shown) applies the FF grouping information 7 to an FF state setting portion 16'.

The FF state setting portion 16' detects, as the indefinite holding FF, the sequential circuit device (FF) having the indefinite value X in the grouped sequential circuit device set on the basis of the signal detection information and FF grouping information 7, and performs the dividing processing such that the indefinite value X outputted from the detected indefinite holding FF is replaced with all determinable states for the output of the indefinite holding FF as the virtual definite values. The FF state setting portion 16' then outputs the divided sequential circuit device information D16 to the logical action analyzer 17.

Other constructions of the simulation executing portion 13' of the third preferred embodiment are similar to those of the simulation executing portion 13 of the second preferred embodiment, and the description thereof will be omitted herein.

The operation of logic simulation of the third preferred embodiment is substantially identical with that of the second preferred embodiment illustrated by the flow charts of FIGS. 7 to 9 except that the steps S21 and S22 of FIG. 7 are omitted and that the FF state setting portion 16' uses the FF grouping information 7 in place of the grouped sequential circuit device information D12 in the step S41 of FIG. 9.

The logic simulator of the third preferred embodiment, therefore, is enabled to execute logic simulation on the logic circuit including practically necessary components in the same fashion as the logic simulator of the second preferred embodiment, thereby increasing the degree of integration and efficiency resulting from reduction in circuit scale and in the number of external signals for the logic circuit to be practically fabricated after the logic simulation.

In addition, the logic simulator of the third preferred embodiment wherein the FF grouping information 7 corresponding to the grouped sequential circuit device information D12 of the second preferred embodiment is provided in advance, is permitted to previously exclude from consideration the grouped sequential circuit devices in the feedback loop which will not output any definite values, thereby effectively reducing the logic simulation time.

While the invention has been shown and described in detail, the foregoing description is in all aspects illustrative and not restrictive. It is therefore understood that numerous modifications and variations can be devised without departing from the scope of the invention.

What is claimed is:

1. A logic simulator comprising:

net list providing means for providing a net list specifying devices forming a circuit to be simulated and connection between said devices;

macro cell data providing means for providing macro cell data specifying various macro cells performing basic logical actions;

test pattern providing means for providing an input test pattern including time series data of an external input signal for logic simulation; and simulation executing means receiving said net list, said macro cell data and said input test pattern for executing logic simulation on said circuit for each macro cell on the basis of said input test pattern, said simulation executing means receiving an input of a macro cell in the form of a logical expression to perform a logical operation when the input has an indefinite value by simulating the basic logical actions of the macro cell based on the indefinite value.

2. The logic simulator of claim 1, wherein said simulation executing means includes:

signal change detecting means receiving said net list and said input test pattern for detecting a change of said external input signal given from said input test pattern and a change of an internal signal between said macro cells in said circuit to output signal detection information; and logical action analyzing means receiving said net list, said macro cell data and said signal detection information for analyzing a logical action for each macro cell specified by said macro cell data for said circuit on the basis of said signal changes given from said signal detection information, said logical action analyzing means receiving an input of a macro cell in the form of a logical expression based on an input signal of its immediately preceding macro cell to perform a logical operation when the input has an indefinite value.

3. The logic simulator of claim 2, further comprising:

simulation end condition detecting means for obtaining a logic simulation end time on the basis of said net list and said input test pattern and for updating a simulation time to indicate the end of said logic simulation executed by said simulation executing means when said updated simulation time is equal to said logic simulation end time.

4. The logic simulator of claim 3, wherein said logical action analyzing means outputs the indefinite value and the logical expression based on the input signal as an output of a macro cell the logical action analysis result of which is indefinite.

5. The logic simulator of claim 4, wherein said macro cell includes a combinational circuit.

6. A logic simulator comprising:

net list providing means for providing a net list specifying devices forming a circuit to be simulated and connection between said devices;

macro cell data providing means for providing macro cell data specifying various macro cells performing basic logical actions, said macro cell data providing means specifying at least a sequential circuit device as a macro cell;

test pattern providing means for providing an input test pattern including time series data of an external input signal for logic simulation;

sequential circuit device searching means receiving said
net list and said macro cell data for searching said
circuit for a sequential circuit device to output a search
result in the form of sequential circuit device information;

feedback sequential circuit device extracting means
receiving said net list and said sequential circuit device
information for extracting a sequential circuit device
given from said sequential circuit device information
and having a feedback loop to output feedback sequential circuit device information specifying the extracted
sequential circuit device as a feedback sequential circuit device; and simulation executing means receiving said net list, said
macro cell data, said input test pattern and said feedback sequential circuit device information for executing logic simulation on said circuit for each macro cell
on the basis of said input test pattern, said simulation executing means, when an output of said
feedback sequential circuit device has an indefinite
value, replacing said indefinite value with n divided
determinable virtual definite values (n≧2) and executing said logic simulation based on said n virtual definite
values in parallel for determination of logical operation
results, to output said logical operation results to the
output of said feedback sequential circuit device when
all of said logical operation results based on said n
divided virtual definite values are equal.

7. The logic simulator of claim 6, wherein said simulation executing means includes:

signal change detecting means receiving said net list and
said input test pattern for detecting a change of said
external input signal given from said input test pattern
and a change of an internal signal between said macro
cells in said circuit to output signal detection information;

sequential circuit device state setting means receiving said
signal detection information and said feedback sequential circuit device information and, on detection of an
indefinite value output feedback sequential circuit
device outputting an indefinite value among said feedback sequential circuit devices, for dividing the indefinite value outputted from said indefinite value output
feedback sequential circuit device into n replaceable
virtual definite values, to thereby set n virtual states;

logical action analyzing means receiving said net list, said
macro cell data and said signal detection information
for analyzing a logical action for each macro cell
specified by said macro cell data for said circuit on the
basis of said signal changes given from said signal
detection information, said logical action analyzing
means analyzing the logical action for said n virtual
states of said indefinite value output feedback sequential circuit device, if found; and sequential circuit device output determining means
receiving the logical action analysis results for said n
virtual states of said indefinite value output feedback
sequential circuit device by said logical action analyzing means for setting the output of said indefinite value
output feedback sequential circuit device to said logical
action analysis results when all of said logical action
analysis results for said n virtual states are equal.

8. The logic simulator of claim 7, further comprising:

simulation end condition detecting means for obtaining a
logic simulation end time on the basis of said net list
and said input test pattern and for updating a simulation
time to indicate the end of said logic simulation
executed by said simulation executing means when said
updated simulation time is equal to said logic simulation end time.

9. The logic simulator of claim 8, wherein said feedback sequential circuit device extracting means
identifies a feedback sequential circuit device group
obtained by grouping a plurality of feedback sequential
circuit devices sharing a feedback loop in extraction of
said feedback sequential circuit devices to add information of said feedback sequential circuit device group
to said feedback sequential circuit device information;

said sequential circuit device state setting means, on
detection of an indefinite value output feedback
sequential circuit device group outputting an indefinite
value among said feedback sequential circuit device
groups, divides the indefinite value outputted from said
indefinite value output feedback sequential circuit
device group into n replaceable virtual definite values,
to thereby set n virtual states;

said logical action analyzing means analyzes the logical
action for said n virtual states of said indefinite value
output feedback sequential circuit device group, if
found; and said sequential circuit device output determining means
receives the logical action analysis results for said n
virtual states of said indefinite value output feedback
sequential circuit device group by said logical action
analyzing means and sets the output of said indefinite
value output feedback sequential circuit device group
to said logical action analysis results when all of said
logical action analysis results for said n virtual states
are equal.

10. The logic simulator of claim 9, wherein said sequential circuit device is a flip-flop.

11. A logic simulator comprising:

net list providing means for providing a net list specifying
devices forming a circuit to be simulated and connection between said devices;

macro cell data providing means for providing macro cell
data specifying various macro cells performing basic
logical actions, said macro cell data providing means
specifying at least a sequential circuit device as a macro
cell;

test patten providing means for providing an input test
pattern including time series data of an external input
signal for logic simulation;

feedback sequential circuit device information providing
means for providing feedback sequential circuit device
information specifying a sequential circuit device
forming said circuit and having a feedback loop as a
feedback sequential circuit device; and simulation executing means receiving said net list, said
macro cell data, said input test pattern and said feedback sequential circuit device information for executing logic simulation on said circuit for each macro cell
on the basis of said input test pattern, said simulation executing means, when an output of said
feedback sequential circuit device has an indefinite
value, replacing said indefinite value with n divided
determinable virtual definite values (n≧2) and executing said logic simulation based on said n virtual definite
values in parallel for determination of logical operation
results, to set the output of said feedback sequential
circuit device to said logical operation results when all of the logical operation results based on said n divided virtual definite values are equal.

12. The logic simulator of claim 11, wherein said simulation executing means includes:

signal change detecting means receiving said net list and said input test pattern for detecting a change of said external input signal given from said input test pattern and a change of an internal signal between said macro cells in said circuit to output signal detection information;

sequential circuit device state setting means receiving said signal detection information and said feedback sequential circuit device information and, on detection of an indefinite value output feedback sequential circuit device outputting an indefinite value among said feedback sequential circuit devices, for dividing the indefinite value outputted from said indefinite value output feedback sequential circuit device into n replaceable virtual definite values, to thereby set n virtual states;

logical action analyzing means receiving said net list, said macro cell data and said signal detection information for analyzing a logical action for each macro cell specified by said macro cell data for said circuit on the basis of said signal changes given from said signal detection information, said logical action analyzing means analyzing the logical action for said n virtual states of said indefinite value output feedback sequential circuit device, if found; and sequential circuit device output determining means receiving the logical action analysis results for said n virtual states of said indefinite value output feedback sequential circuit device by said logical action analyzing means for setting the output of said indefinite value output feedback sequential circuit device to said logical action analysis results when all of said logical action analysis results for said n virtual states are equal.

* * * * *